(12) United States Patent
Wang et al.

(10) Patent No.: US 11,391,789 B2
(45) Date of Patent: Jul. 19, 2022

(54) METHOD FOR DIAGNOSING FAULT OF LLC RESONANT CONVERTER BASED ON RESONANT CAPACITOR VOLTAGE

(71) Applicant: Central South University, Changsha (CN)

(72) Inventors: Chunsheng Wang, Changsha (CN); Kaiyuan Tan, Changsha (CN); Jianhui Mao, Changsha (CN); Pengcheng Wang, Changsha (CN)

(73) Assignee: CENTRAL SOUTH UNIVERSITY, Changsha (CN)

( * ) Notice: Subject to any disclaimer, the term of this patent is extended or adjusted under 35 U.S.C. 154(b) by 63 days.

(21) Appl. No.: 17/143,844

(22) Filed: Jan. 7, 2021

(65) Prior Publication Data

US 2021/0215771 A1    Jul. 15, 2021

(30) Foreign Application Priority Data

Jan. 9, 2020    (CN) .......................... 202010020591.4

(51) Int. Cl.
*G01R 31/54* (2020.01)
*G01R 19/165* (2006.01)
*H02M 3/335* (2006.01)

(52) U.S. Cl.
CPC ........... *G01R 31/54* (2020.01); *G01R 19/165* (2013.01); *H02M 3/33569* (2013.01)

(58) Field of Classification Search
CPC .. G01R 31/54; G01R 19/165; H02M 3/33569
See application file for complete search history.

(56) References Cited

U.S. PATENT DOCUMENTS

2008/0298099 A1* 12/2008 Huang .................... H02M 1/32
363/50

FOREIGN PATENT DOCUMENTS

| CN | 104597370 | A  | * | 5/2015  |            |
|----|-----------|----|---|---------|------------|
| CN | 204903623 | U  | * | 12/2015 |            |
| CN | 106405307 | A  | * | 2/2017  | G01R 31/026|
| CN | 106885966 | A  | * | 6/2017  | G01R 31/02 |
| CN | 107589335 | A  | * | 1/2018  |            |
| JP | 2017163714| A  | * | 9/2017  | H02M 7/48  |
| KR | 100911540 | B1 | * | 8/2009  | G01R 31/40 |

\* cited by examiner

*Primary Examiner* — Alexander Satanovsky
*Assistant Examiner* — Asm Fakhruddin
(74) *Attorney, Agent, or Firm* — Leason Ellis LLP

(57) ABSTRACT

The present disclosure provides a method for diagnosing an open fault of an LLC resonant converter based on a resonant capacitor voltage, including: specifying a proper threshold based on an amplitude of a resonant capacitor voltage when an LLC resonant converter works normally; sampling the resonant capacitor voltage after a fault occurs, and comparing the sampled resonant capacitor voltage with the specified threshold to diagnose the fault; and controlling phase shifting between bridge arms to locate the fault. Characterized by a high diagnosis speed, a low misdiagnosis rate, and good robustness, the method for diagnosing an open fault of an LLC resonant converter in the present disclosure is of great significance for ensuring uninterrupted running of the LLC resonant converter when the open fault occurs on the LLC resonant converter.

7 Claims, 3 Drawing Sheets ic field of power electronics, and more specifically, to a method for diagnosing a fault of an LLC resonant converter based on a resonant capacitor voltage.

METHOD FOR DIAGNOSING FAULT OF LLC RESONANT CONVERTER BASED ON RESONANT CAPACITOR VOLTAGE

TECHNICAL FIELD

The present disclosure relates to the technical field of power electronics, and more specifically, to a method for diagnosing a fault of an LLC resonant converter based on a resonant capacitor voltage.

BACKGROUND

With the rapid development of power electronic technologies, LLC resonant converters are widely used in new energy development, energy saving, and consumption reduction. As a direct current (DC)-DC converter with an isolated transformer, an LLC resonant converter can be simply controlled and can support zero-voltage switching. Therefore, the LLC resonant converter is widely applied to various fields of modern industry, for example, to a solid-state transformer as an intermediate isolation stage, to implement voltage amplitude adjustment and electrical isolation of primary and secondary sides. In a power supply system of a more-electric aircraft, the LLC resonant converter functions as a core power electronic converter to convert electrical energy.

The LLC resonant converter is a core part for converting the electrical energy, and therefore, a fault of the LLC resonant converter seriously affects an entire power electronic system. In this way, an effective method for diagnosing a fault of the LLC resonant converter is of great significance for improving reliability of the entire power electronic system. At present, the research on fault diagnosis of the DC-DC converter mostly focuses on a bidirectional active bridge (DAB). In addition, most diagnosis methods are complicated and are not applicable to the LLC resonant converter.

SUMMARY

The present disclosure aims to provide a method for diagnosing a fault of an LLC resonant converter based on a resonant capacitor voltage, to resolve the foregoing problems in fault diagnosis of the DC-DC converter. In this method, an acquired resonant capacitor voltage and a specified threshold voltage are compared to obtain a fault determining signal, and then phase-shifted pulse width modulation (PWM) is performed to locate a fault. Characterized by a simple algorithm, a high fault diagnosis speed, a low misdiagnosis rate, and good robustness, the fault diagnosis method provided in the present disclosure is of great significance for ensuring uninterrupted running of the LLC resonant converter when an open fault occurs on the LLC resonant converter.

To resolve all or at least some of the foregoing problems, the present disclosure provides a method according to one embodiment for diagnosing a fault of an LLC resonant converter based on a resonant capacitor voltage. The method in accordance with variations of this embodiment includes:

obtaining fault determining signals $F_0$, $F_1$, and $F_2$ by comparing a resonant capacitor voltage of an LLC resonant converter with zero, a first threshold voltage $u_1^*$, and a second threshold voltage $-u_1^*$, and triggering a controller to generate a phase-shifted PWM signal; and sampling the resonant capacitor voltage of the LLC resonant converter, obtaining fault position signals $F_{S1}$, $F_{S2}$, $F_{S3}$, and $F_{S4}$ based on values of $F_1$ and $F_2$ by comparing the resonant capacitor voltage with a third threshold voltage $u_2^*$, a fourth threshold voltage $-u_2^*$, a fifth threshold voltage $u_3^*$, and a sixth threshold voltage $-u_3^*$, and determining a position of an open fault.

The obtaining fault determining signals by comparing a resonant capacitor voltage of an LLC resonant converter with zero, a first threshold voltage $u_1^*$, and a second threshold voltage $-u_1^*$, and triggering a controller to generate a phase-shifted PWM signal specifically includes:

acquiring the resonant capacitor voltage $u_{cr}$;

comparing the resonant capacitor voltage $u_{cr}$ with zero to obtain the fault determining signal $F_0$, and if a comparison result is alternately positive and negative, determining that a value of $F_0$ is 0, or if a comparison result is positive or negative, determining that a value of $F_0$ is 1;

comparing the resonant capacitor voltage $u_{cr}$ with the first threshold voltage $u_1^*$ and the second threshold voltage $-u_1^*$, and if the value of the fault determining signal $F_0$ is 1 and the resonant capacitor voltage $u_{cr}$ is greater than the first threshold voltage $u_1^*$, determining that the value of the fault determining signal $F_1$ is 1, or if the value of the fault determining signal $F_0$ is 1 and the resonant capacitor voltage is less than the second threshold voltage $-u_1^*$, determining that the value of the fault determining signal $F_2$ is 1;

if the value of $F_1$ or $F_2$ is 1, determining that the fault occurs, where in this case, a fault diagnosis circuit sends a fault signal to a control circuit, and the control circuit generates the phase-shifted PWM signal to be used for a power tube; and if the value of $F_0$ is 0, determining that no fault occurs.

The obtaining fault position signals $F_{S1}$, $F_{S2}$, $F_{S3}$, and $F_{S4}$ based on values of $F_1$ and $F_2$ by comparing the resonant capacitor voltage with a third threshold voltage $u_2^*$, a fourth threshold voltage $-u_2^*$, a fifth threshold voltage $u_3^*$, and a sixth threshold voltage $-u_3^*$, and determining a position of an open fault specifically includes:

acquiring the resonant capacitor voltage $u_{cr}$;

comparing the resonant capacitor voltage $u_{cr}$ with the third threshold voltage $u_2^*$, the fourth threshold voltage $-u_2^*$, the fifth threshold voltage $u_3^*$, and the sixth threshold voltage $-u_3^*$, and if the value of $F_1$ is 1 and the resonant capacitor voltage is greater than the fifth threshold voltage $u_3^*$, determining that a value of the fault position signal $F_{S3}$ is 1, and determining that the open fault occurs on $S_3$; or if the value of $F_1$ is 1 and the resonant capacitor voltage is less than the third threshold voltage $u_2^*$, determining that a value of the fault position signal $F_{S2}$ is 1, and determining that the open fault occurs on $S_2$; and if the value of $F_2$ is 1 and the resonant capacitor voltage is greater than the fourth threshold voltage $-u_2^*$, determining that a value of the fault position signal $F_{S1}$ is 1, and determining that the open fault occurs on $S_1$; or if the value of $F_2$ is 1 and the resonant capacitor voltage is less than the sixth threshold voltage $-u_3^*$, determining that a value of the fault position signal $F_{S4}$ is 1, and determining that the open fault occurs on $S_4$.

The first threshold voltage $u_1^*$ may be greater than a peak resonant capacitor voltage under a normal working condition.

The third threshold voltage $u_2^*$ may be less than the first threshold voltage $u_1^*$ and greater than zero.

The fifth threshold voltage $u_3^*$ may be greater the first threshold voltage $u_1^*$.

The phase-shifted PWM signal generated by the control circuit may be ignoring dead time, PWM signals of $S_1$, $S_2$, $S_3$, $S_4$ may all be square waves with a duty cycle of 50%, whereby the PWM signal of $S_4$ lags behind that of $S_1$ by ¼ of one cycle, the PWM signal of $S_2$ lags behind that of $S_1$ by ½ of one cycle, and the PWM signal of $S_3$ lags behind that of $S_1$ by ¾ of one cycle.

Compared with the prior art, the method for diagnosing a fault of an LLC resonant converter based on a resonant capacitor voltage in the present disclosure compares the acquired resonant capacitor voltage and the specified threshold voltage to obtain the fault determining signal, and then performs phase-shifted PWM to locate the fault. Characterized by a simple algorithm, a high fault diagnosis speed, a low misdiagnosis rate, and good robustness, the fault diagnosis method provided in the present disclosure is of great significance for ensuring uninterrupted running of the LLC resonant converter when the open fault occurs on the LLC resonant converter.

BRIEF DESCRIPTION OF THE DRAWINGS

To describe the technical solutions in the embodiments of the present disclosure or in the prior art more clearly, the following will briefly describe the drawings required for describing the embodiments. Apparently, the drawings in the following description are only some of the embodiments of the present disclosure, and other drawings may be obtained by those of ordinary skill in the art based on these drawings without creative efforts.

DETAILED DESCRIPTION

Figure 1:
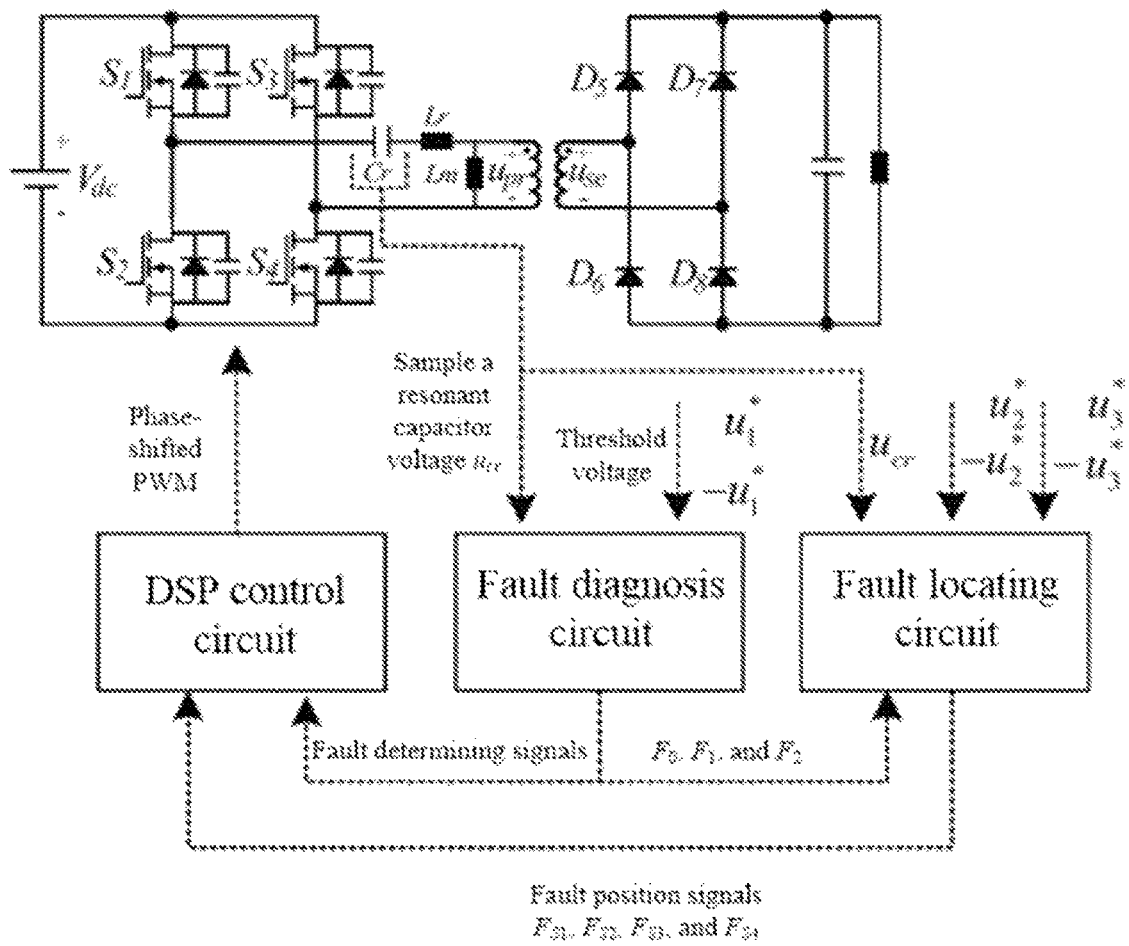
FIG. 1 shows a principle of a method for diagnosing a fault of an LLC resonant converter based on a resonant capacitor voltage according to an embodiment of the present disclosure.
Figure 2:
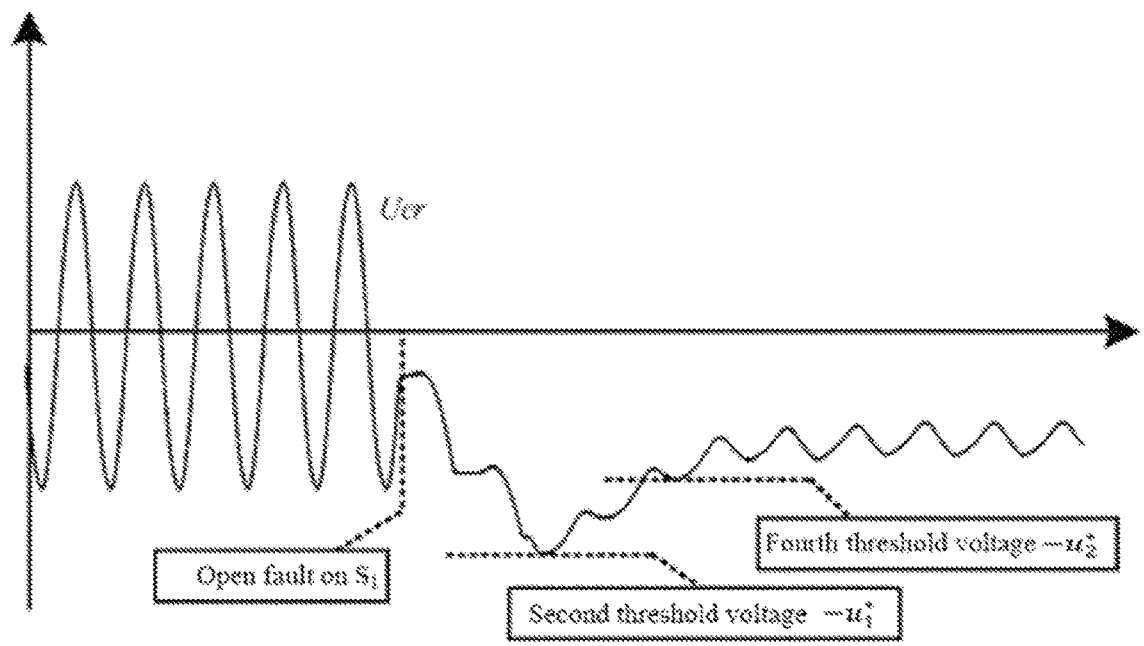
FIG. 2 shows a waveform of a resonant capacitor voltage when an open fault occurs on $S_1$ according to an embodiment of the present disclosure.
Figure 3:
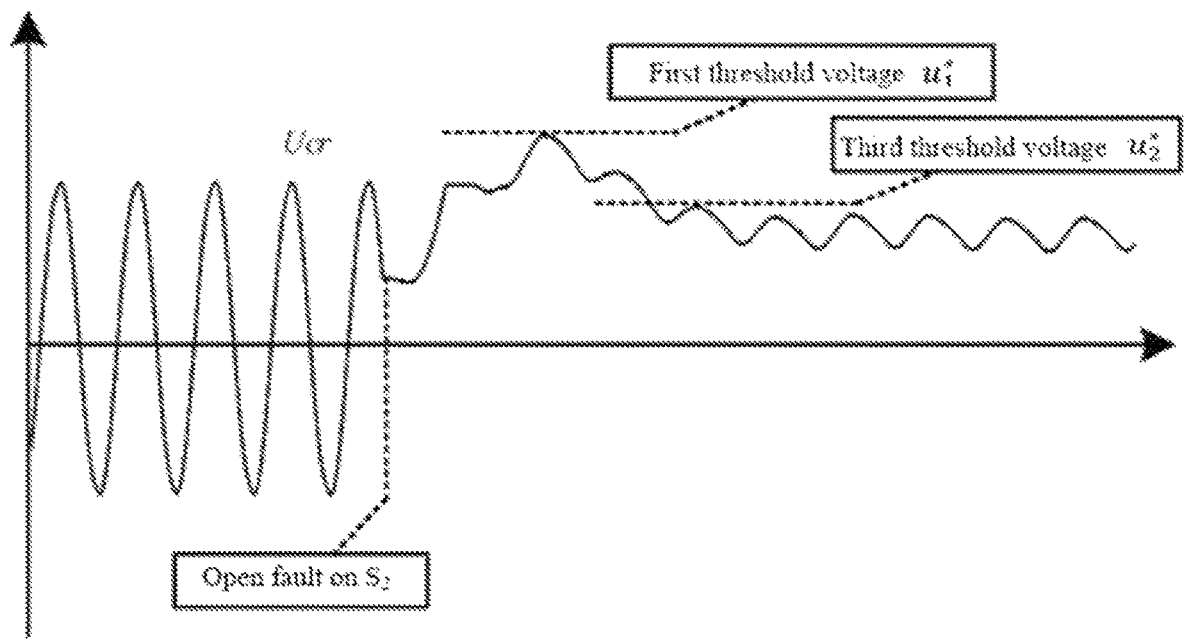
FIG. 3 shows a waveform of a resonant capacitor voltage when an open fault occurs on $S_2$ according to an embodiment of the present disclosure.
Figure 4:
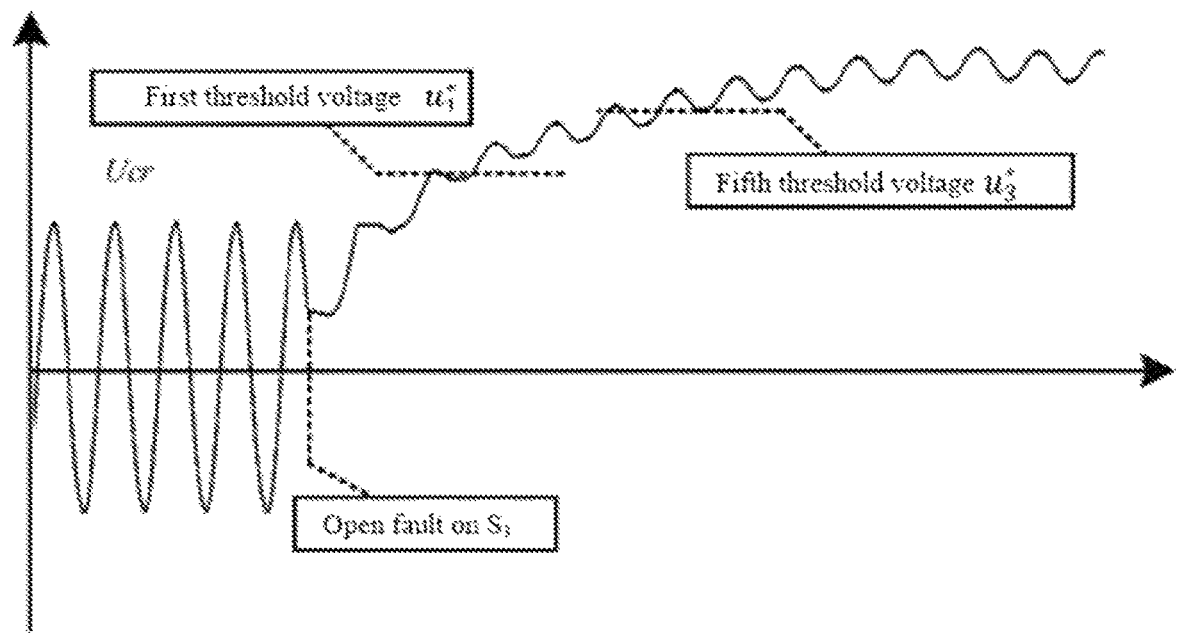
FIG. 4 shows a waveform of a resonant capacitor voltage when an open fault occurs on $S_3$ according to an embodiment of the present disclosure.
Figure 5:
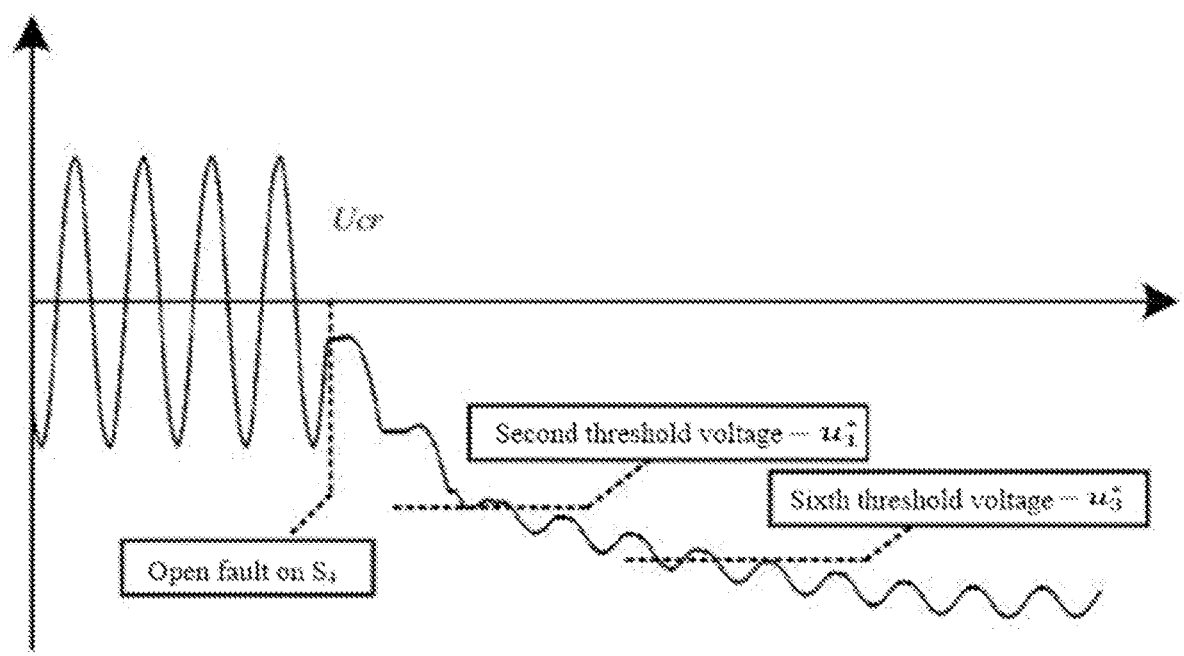
FIG. 5 shows a waveform of a resonant capacitor voltage when an open fault occurs on $S_4$ according to an embodiment of the present disclosure.

In order to make the objectives, technical solutions and advantages of the embodiments of the present disclosure clearer, the following clearly and completely describes the technical solutions in the embodiments of the present disclosure with reference to accompanying drawings in the embodiments of the present disclosure. Apparently, the described embodiments are some rather than all of the embodiments. All other embodiments obtained by a person of ordinary skill in the art based on the embodiments of the present disclosure without creative efforts shall fall within the protection scope of the present disclosure.

An embodiment of the present disclosure provides a method for diagnosing an LLC fault based on a resonant capacitor voltage. The method comprises:

obtaining fault determining signals $F_0$, $F_1$, and $F_2$ by comparing a resonant capacitor voltage of an LLC resonant converter with zero, a first threshold voltage $u_1^*$, and a second threshold voltage $-u_1^*$, and triggering a controller to generate a phase-shifted PWM signal; and sampling the resonant capacitor voltage of the LLC resonant converter, obtaining fault position signals $F_{S1}$, $F_{S2}$, $F_{S3}$, and $F_{S4}$ based on values of $F_1$ and $F_2$ by comparing the resonant capacitor voltage with a third threshold voltage $u_2^*$, a fourth threshold voltage $-u_2^*$, a fifth threshold voltage $u_3^*$, and a sixth threshold voltage $-u_3^*$, and determining a position of an open fault.

In this embodiment, a peak resonant capacitor voltage is 45 V, the first threshold voltage $u_1^*$ is 60 V, the second threshold voltage $-u_1^*$ is $-60$ V, the third threshold voltage $u_2^*$ is 40 V, the fourth threshold voltage $-u_2^*$ is $-40$ V, the fifth threshold voltage $u_3^*$ is 80 V, and the sixth threshold voltage $u_3^*$ is $-80$ V.

The obtaining fault determining signals by comparing a resonant capacitor voltage of an LLC resonant converter with zero, a first threshold voltage $u_1^*$, and a second threshold voltage $-u_1^*$, and triggering a controller to generate a phase-shifted PWM signal according to one embodiment specifically comprises:

acquiring the resonant capacitor voltage $u_{cr}$;

comparing the resonant capacitor voltage $u_{cr}$ with zero to obtain the fault determining signal $F_0$, and if a comparison result is alternately positive and negative, determining that a value of $F_0$ is 0, or if a comparison result is positive or negative, determining that a value of $F_0$ is 1;

comparing the resonant capacitor voltage $u_{cr}$ with the first threshold voltage $u_1^*$ and the second threshold voltage $-u_1^*$, and if the value of the fault determining signal $F_0$ is 1 and the resonant capacitor voltage $u_{cr}$ is greater than the first threshold voltage $u_1^*$, determining that the value of the fault determining signal $F_1$ is 1, or if the value of the fault determining signal $F_0$ is 1 and the resonant capacitor voltage is less than the second threshold voltage $-u_1^*$, determining that the value of the fault determining signal $F_2$ is 1;

if the value of $F_1$ or $F_2$ is 1, determining that the fault occurs, where in this case, a fault diagnosis circuit sends a fault signal to a control circuit, and the control circuit generates the phase-shifted PWM signal to be used for a power tube; and if the value of $F_0$ is 0, determining that no fault occurs.

The obtaining fault position signals $F_{S1}$, $F_{S2}$, $F_{S3}$, and $F_{S4}$ based on values of $F_1$ and $F_2$ by comparing the resonant capacitor voltage with a third threshold voltage $u_2^*$, a fourth threshold voltage $-u_2^*$, a fifth threshold voltage $u_3^*$, and a sixth threshold voltage $-u_3^*$, and determining a position of an open fault specifically includes:

acquiring the resonant capacitor voltage $u_{cr}$;

comparing the resonant capacitor voltage $u_{cr}$ with the third threshold voltage $u_2^*$, the fourth threshold voltage $-u_2^*$, the fifth threshold voltage $u_3^*$, and the sixth threshold voltage $-u_3^*$, and if the value of $F_1$ is 1 and the resonant capacitor voltage is greater than the fifth threshold voltage $u_3^*$, determining that a value of the fault position signal $F_{S3}$ is 1, and determining that the open fault occurs on $S_3$; or if the value of $F_1$ is 1 and the resonant capacitor voltage is less than the third threshold voltage $u_2^*$, determining that a value of the fault position signal $F_{S2}$ is 1, and determining that the open fault occurs on $S_2$; and if the value of $F_2$ is 1 and the resonant capacitor voltage is greater than the fourth threshold voltage $-u_2^*$, determining that a value of the fault position signal $F_{S1}$ is 1, and determining that the open fault occurs on $S_1$; or if the value of $F_2$ is 1 and the resonant capacitor voltage is less than the sixth threshold voltage $-u_3^*$, determining that a value of the fault position signal $F_{S4}$ is 1, and determining that the open fault occurs on $S_4$.

In accordance with the present embodiments, the phase-shifted PWM signal generated by the control circuit is ignoring dead time, PWM signals of $S_1$, $S_2$, $S_3$, $S_4$ are all square waves with a duty cycle of 50%, the PWM signal of $S_4$ lags behind that of $S_1$ by ¼ of one cycle, the PWM signal of $S_2$ lags behind that of $S_1$ by ½ of one cycle, and the PWM signal of $S_3$ lags behind that of $S_1$ by ¾ of one cycle.

Finally, the method in the present disclosure is only a preferred example, and not intended to limit the protection scope of the present disclosure. Any modifications, equivalent substitutions, improvements, and the like within the spirit and principles of the present disclosure are intended to be included within the protection scope of the present disclosure.

What is claimed is:

1. A method for diagnosing an LLC fault based on a resonant capacitor voltage, comprising the following process:

obtaining fault determining signals $F_0$, $F_1$, and $F_2$ by comparing a resonant capacitor voltage of an LLC resonant converter with zero, a first threshold voltage $u_1^*$, and a second threshold voltage $-u_1^*$, and triggering a controller to generate a phase-shifted pulse width modulation (PWM) signal;

sampling the resonant capacitor voltage of the LLC resonant converter; and obtaining fault position signals $F_{S1}$, $F_{S2}$, $F_{S3}$, and $F_{S4}$ based on values of $F_1$ and $F_2$ by comparing the resonant capacitor voltage with a third threshold voltage $u_2^*$, a fourth threshold voltage $-u_2^*$, a fifth threshold voltage $u_3^*$, and a sixth threshold voltage $-u_3^*$, to determine a position of an open fault.

2. The method for diagnosing an LLC fault based on a resonant capacitor voltage according to claim 1, wherein the obtaining fault determining signals by comparing a resonant capacitor voltage of an LLC resonant converter with zero, a first threshold voltage $u_1^*$, and a second threshold voltage $-u_1^*$, and triggering a controller to generate a phase-shifted PWM signal specifically comprises:

acquiring the resonant capacitor voltage $u_{cr}$;

comparing the resonant capacitor voltage $u_{cr}$ with zero to obtain the fault determining signal $F_0$, and if a comparison result is alternately positive and negative, determining that a value of $F_0$ is 0, or if a comparison result is positive or negative, determining that a value of $F_0$ is 1;

comparing the resonant capacitor voltage $u_{cr}$ with the first threshold voltage $u_1^*$ and the second threshold voltage $-u_1^*$, and if the value of the fault determining signal $F_0$ is 1 and the resonant capacitor voltage $u_{cr}$ is greater than the first threshold voltage $u_1^*$, determining that the value of the fault determining signal $F_1$ is 1, or if the value of the fault determining signal $F_0$ is 1 and the resonant capacitor voltage is less than the second threshold voltage $-u_1^*$, determining that the value of the fault determining signal $F_2$ is 1;

if the value of $F_1$ or $F_2$ is 1, determining that the open fault occurs that causes a fault diagnosis circuit to send a fault signal to a control circuit to generate the phase-shift PWM signal to be used for a power tube; and if the value of $F_0$ is 0, determining that no fault occurs.

3. The method for diagnosing an LLC fault based on a resonant capacitor voltage according to claim 1, wherein the obtaining fault position signals $F_{S1}$, $F_{S2}$, $F_{S3}$, and $F_{S4}$ based on values of $F_1$ and $F_2$ by comparing the resonant capacitor voltage with a third threshold voltage $u_2^*$, a fourth threshold voltage $-u_2^*$, a fifth threshold voltage $u_3^*$, and a sixth threshold voltage $-u_3^*$, and determining a position of an open fault comprises:

acquiring the resonant capacitor voltage $u_{cr}$;

comparing the resonant capacitor voltage $u_{cr}$ with the third threshold voltage $u_2^*$, the fourth threshold voltage $-u_2^*$, the fifth threshold voltage $u_3^*$, and the sixth threshold voltage $-u_3^*$, and if the value of $F_1$ is 1 and the resonant capacitor voltage is greater than the fifth threshold voltage $u_3^*$, determining that a value of the fault position signal $F_{S3}$ is 1, and determining that the open fault occurs on $S_3$; or if the value of $F_1$ is 1 and the resonant capacitor voltage is less than the third threshold voltage $u_2^*$, determining that a value of the fault position signal $F_{S2}$ is 1, and determining that the open fault occurs on $S_2$; and if the value of $F_2$ is 1 and the resonant capacitor voltage is greater than the fourth threshold voltage $-u_2^*$, determining that a value of the fault position signal $F_{S1}$ is 1, and determining that the open fault occurs on $S_1$; or if the value of $F_2$ is 1 and the resonant capacitor voltage is less than the sixth threshold voltage $-u_3^*$, determining that a value of the fault position signal $F_{S4}$ is 1, and determining that the open fault occurs on $S_4$.

4. The method for diagnosing an LLC fault based on a resonant capacitor voltage according to claim 2, wherein the phase-shifted PWM signal is ignoring dead time, PWM signals of $S_1$, $S_2$, $S_3$, $S_4$ of the LLC resonant converter are all square waves with a duty cycle of 50%, the PWM signal of $S_4$ lags behind that of $S_1$ by ¼ of one cycle, the PWM signal of $S_2$ lags behind that of $S_1$ by ½ of one cycle, and the PWM signal of $S_3$ lags behind that of $S_1$ by ¾ of one cycle.

5. The method for diagnosing an LLC fault based on a resonant capacitor voltage according to claim 1, wherein the first threshold voltage $u_1^*$ is greater than a peak resonant capacitor voltage under a normal working condition.

6. The method for diagnosing an LLC fault based on a resonant capacitor voltage according to claim 1, wherein the third threshold voltage $u_2^*$ is less than the first threshold voltage $u_1^*$ and greater than zero.

7. The method for diagnosing an LLC fault based on a resonant capacitor voltage according to claim 1, wherein the fifth threshold voltage $u_3^*$ is greater than the first threshold voltage $u_1^*$.

* * * * *